US009047082B2

(12) United States Patent
Gopal et al.

(10) Patent No.: US 9,047,082 B2
(45) Date of Patent: *Jun. 2, 2015

(54) INSTRUCTION-SET ARCHITECTURE FOR PROGRAMMABLE CYCLIC REDUNDANCY CHECK (CRC) COMPUTATIONS

(71) Applicant: Intel Corporation, Santa Clara, CA (US)

(72) Inventors: Vinodh Gopal, Westborough, MA (US); Shay Gueron, Haifa (IL); Gilbert Wolrich, Framingham, MA (US); Wajdi Feghali, Boston, MA (US); Kirk Yap, Framingham, MA (US); Bradley Burres, Waltham, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/254,233

(22) Filed: Apr. 16, 2014

(65) Prior Publication Data

US 2014/0229807 A1    Aug. 14, 2014

Related U.S. Application Data

(63) Continuation of application No. 13/793,358, filed on Mar. 11, 2013, now Pat. No. 8,732,548, which is a continuation of application No. 12/653,249, filed on Dec. 10, 2009, now Pat. No. 8,464,125.

(51) Int. Cl.
*G06F 11/00*    (2006.01)
*G06F 9/30*    (2006.01)

(Continued)

(52) U.S. Cl.
CPC ......... *G06F 9/30145* (2013.01); *H03M 13/091* (2013.01); *G06F 9/30018* (2013.01); *G06F 11/1004* (2013.01); *H03M 13/09* (2013.01)

(58) Field of Classification Search
CPC .... H03M 13/09; H03M 13/091; H03M 13/15
See application file for complete search history.

(56) References Cited

U.S. PATENT DOCUMENTS 6,836,869 B1 * 12/2004 Wyland .......................... 714/781
7,958,436 B2 *  6/2011 King et al. .................... 714/781
8,156,401 B2 *  4/2012 King et al. .................... 714/758

(Continued)

FOREIGN PATENT DOCUMENTS

CN    101305349    12/2006
EP    0 857 001 A1    8/1998

(Continued)

OTHER PUBLICATIONS

Taiwanese Patent Office, Office Action and Search Report mailed Nov. 29, 2013 in Taiwanese application No. 099134899.
German Patent and Trademark Office, Office Action mailed Jun. 21, 2013 in German application No. 10 2010 049 322.8.
E.R. Blem, et al., "Instruction Set Extensions for Cyclic Redundancy Check on a Multithreaded Processor," Nov. 2005, 7 pages.

(Continued)

*Primary Examiner* — Amine Riad
(74) *Attorney, Agent, or Firm* — Trop, Pruner & Hu, P.C.

(57) ABSTRACT

A method and apparatus to perform Cyclic Redundancy Check (CRC) operations on a data block using a plurality of different n-bit polynomials is provided. A flexible CRC instruction performs a CRC operation using a programmable n-bit polynomial. The n-bit polynomial is provided to the CRC instruction by storing the n-bit polynomial in one of two operands.

20 Claims, 9 Drawing Sheets

(51) Int. Cl.
*H03M 13/09* (2006.01)
*G06F 11/10* (2006.01)

(56) References Cited

U.S. PATENT DOCUMENTS

| | | | |
|---|---|---|---|
| 2003/0093752 A1* | 5/2003 | Chen | 714/781 |
| 2007/0150795 A1* | 6/2007 | King et al. | 714/781 |
| 2007/0226580 A1* | 9/2007 | King et al. | 714/758 |
| 2008/0092020 A1* | 4/2008 | Hasenplaugh et al. | 714/781 |
| 2011/0145679 A1* | 6/2011 | King et al. | 714/763 |
| 2012/0042153 A1* | 2/2012 | Morrison et al. | 712/227 |

FOREIGN PATENT DOCUMENTS

| | | |
|---|---|---|
| JP | 2009-521059 | 5/2009 |
| TW | 200809488 | 12/1995 |
| TW | 200832935 | 10/1996 |
| WO | WO 2007/078672 | 7/2007 |

OTHER PUBLICATIONS

Wikipedia, "Cyclic Redundancy Check," http://en.wikipedia.org/wiki/Cyclic_redundancy_check, [retrieved on Sep. 18, 2013], 11 pages.
Korean Patent and Trademark Office, Office Action mailed May 20, 2013 in Korean application No. 2010-0125762.
State Intellectual Property Office of the People's Republic of China, Office Action mailed Jun. 25, 2013 in Chinese application No. 201010581502.X.
State Intellectual Property Office of the People's Republic of China, Office Action mailed Jan. 16, 2013 in Chinese application No. 201010581502.X.
Japanese Patent Office, Office Action mailed Oct. 30, 2012 in Japanese application No. 2010-269989.
Korean Patent Office, Notice of Preliminary Rejection mailed Jul. 4, 2012 in Korean application No. 2010-0125762.

* cited by examiner

INSTRUCTION-SET ARCHITECTURE FOR PROGRAMMABLE CYCLIC REDUNDANCY CHECK (CRC) COMPUTATIONS

This application is a continuation of U.S. patent application Ser. No. 13/793,358, filed Mar. 11, 2013, which is a continuation of U.S. patent application Ser. No. 12/653,249, filed Dec. 10, 2009, now U.S. Pat. No. 8,464,125, issued Jun. 11, 2013, the content of which is hereby incorporated by reference.

TECHNICAL FIELD

This disclosure relates to error checking and in particular to the use of Cyclic Redundancy Check (CRC) for error checking.

BACKGROUND

A polynomial is a mathematical expression of one or more algebraic terms, for example, "a+bx+cx.sup.2", each of which consists of a constant (a, b or c) multiplied by one or more variables (x) raised to a nonnegative integral power. A fixed size remainder of binary division of a data block by an n-bit polynomial may be used to verify that there were no transmission errors when transmitting the data block from a source to a destination. An n-bit polynomial applied to a data block of arbitrary length detects any single error burst that is less than or equal to n bits.

The fixed size remainder is computed for a data block at a source and is transmitted with the data block. The n-bit polynomial is applied to the received data block at the destination to re-compute the fixed size remainder. The recomputed fixed size remainder is compared with the fixed size remainder transmitted with the data block to verify that there were no transmission errors.

A Cyclic Redundancy Check (CRC) is a term that is given to both a fixed size remainder (a residue of binary division of an arbitrary length data block by a fixed size polynomial) and the function to produce the fixed size remainder.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

There are many known methods to perform Cyclic Redundancy Check (CRC) calculations. One method is to use a dedicated CRC circuit to implement a specific n-bit polynomial. Another method is to use a CRC lookup table to store all possible CRC results for a given n-bit polynomial and set of data inputs and remainders. For this method, one table lookup is performed in the CRC lookup table to determine the CRC result.

However, there are many different n-bit polynomials that are used to compute a CRC. For example, different n-bit polynomials are used to compute CRCs for storage protocols such as Internet Small Computer Systems Interface (iSCSI), compression and decompression and graphics operations, for example, Moving Pictures Experts Group (MPEG) and Joint Photographic Experts Group (JPEG). Thus, a dedicated CRC circuit or separate lookup table is required to compute CRC for each different n-bit polynomial.

CRC computation may also be performed in hardware through the use of a dedicated CPU instruction. However, as a CPU instruction is limited by the number and size of operands. The CRC instruction is dedicated to computing CRC for one particular fixed n-bit polynomial.

In an embodiment of the present invention, an instruction set architecture is provided to perform CRC operations using a plurality of different n-bit polynomials. In an embodiment, a flexible CRC instruction supports n-bit polynomials up to a maximal degree of 32 (that is, n-bit polynomials with bit x.sup.n(n+1th bit) set to logical '1' are supported). The flexible CRC instruction also supports bit/byte reflects on the data/residue.

Figure 1:
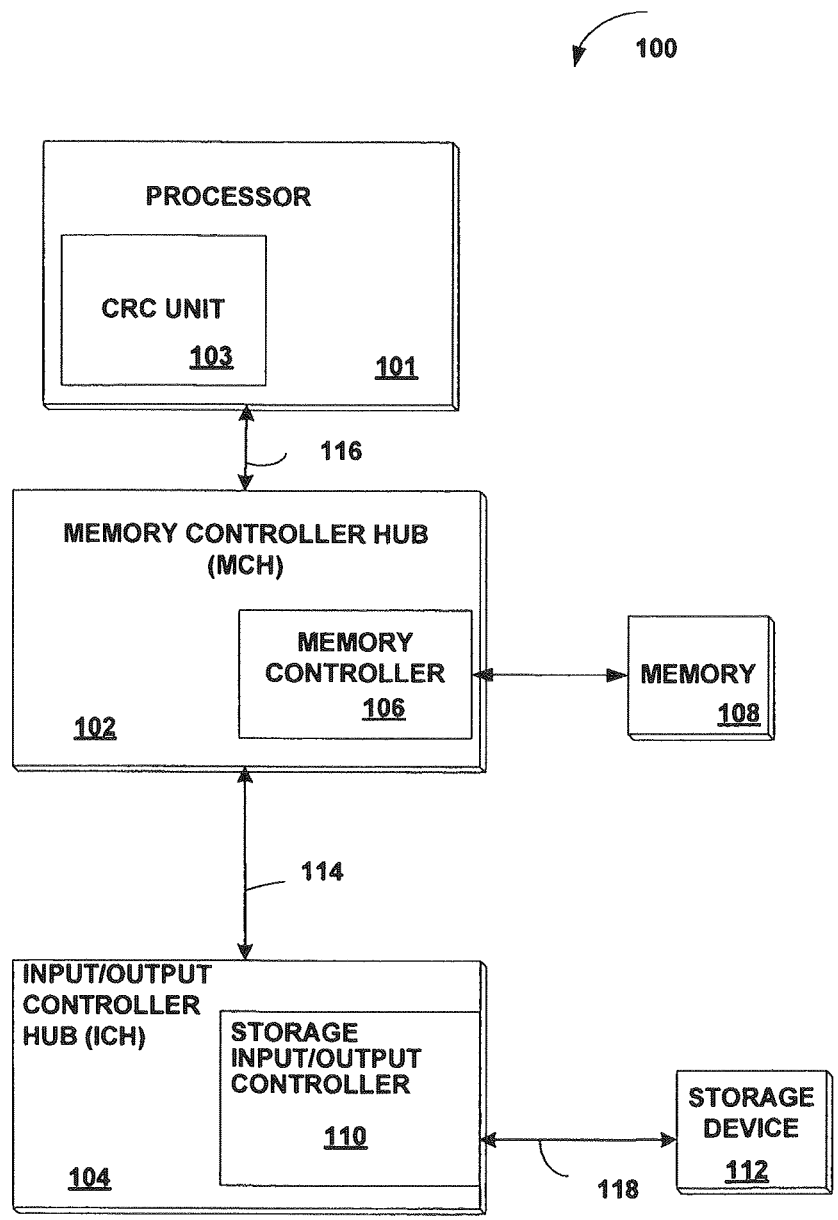
FIG. 1 is a block diagram of a system that includes an embodiment of an instruction to perform Cyclic Redundancy Check (CRC) in a general purpose processor according to the principles of the present invention.

FIG. 1 is a block diagram of a system 100 that includes an embodiment of an instruction to perform CRC operations in a general purpose processor according to the principles of the present invention. The system 100 includes a processor 101, a Memory Controller Hub (MCH) 102 and an Input/Output (I/O) Controller Hub (ICH) 104. The MCH 102 includes a memory controller 106 that controls communication between the processor 101 and memory 108. The processor 101 and MCH 102 communicate over a system bus 116.

The processor 101 may be any one of a plurality of processors such as a single core Intel® Pentium IV® processor, a single core Intel Celeron processor, an Intel® XScale processor or a multi-core processor such as Intel® Pentium D, Intel® Xeon® processor, or Intel® Core® Duo processor or any other type of processor.

The memory 108 may be Dynamic Random Access Memory (DRAM), Static Random Access Memory (SRAM), Synchronized Dynamic Random Access Memory (SDRAM), Double Data Rate 2 (DDR2) RAM or Rambus Dynamic Random Access Memory (RDRAM) or any other type of memory.

The ICH 104 may be coupled to the MCH 102 using a high speed chip-to-chip interconnect 114 such as Direct Media Interface (DMI). DMI supports 2 Gigabit/second concurrent transfer rates via two unidirectional lanes.

The ICH 104 may include a storage I/O controller 110 for controlling communication with at least one storage device 112 coupled to the ICH 104. The storage device may be, for example, a disk drive, Digital Video Disk (DVD) drive, Compact Disk (CD) drive, Redundant Array of Independent Disks (RAID), tape drive or other storage device. The ICH 104 may communicate with the storage device 112 over a storage protocol interconnect 118 using a serial storage protocol such as, Serial Attached Small Computer System Interface (SAS) or Serial Advanced Technology Attachment (SATA).

The processor 101 includes a CRC unit 103 to perform CRC operations. The CRC unit 103 may be used to compute CRC using a plurality of different n-bit polynomials for data stored in memory 108 and/or stored in the storage device 112.

Cyclic Redundancy Check (CRC) operations are performed on a data block using one of a plurality of different n-bit polynomials. A flexible CRC instruction performs a CRC operation using a programmable n-bit polynomial. Instead of performing a CRC operation for a fixed (static) polynomial stored in the CRC unit 103, the n-bit polynomial is provided to the CRC unit 103 via a CRC instruction by storing the n-bit polynomial in one of two operands to provide a flexible CRC instruction.

Figure 2:
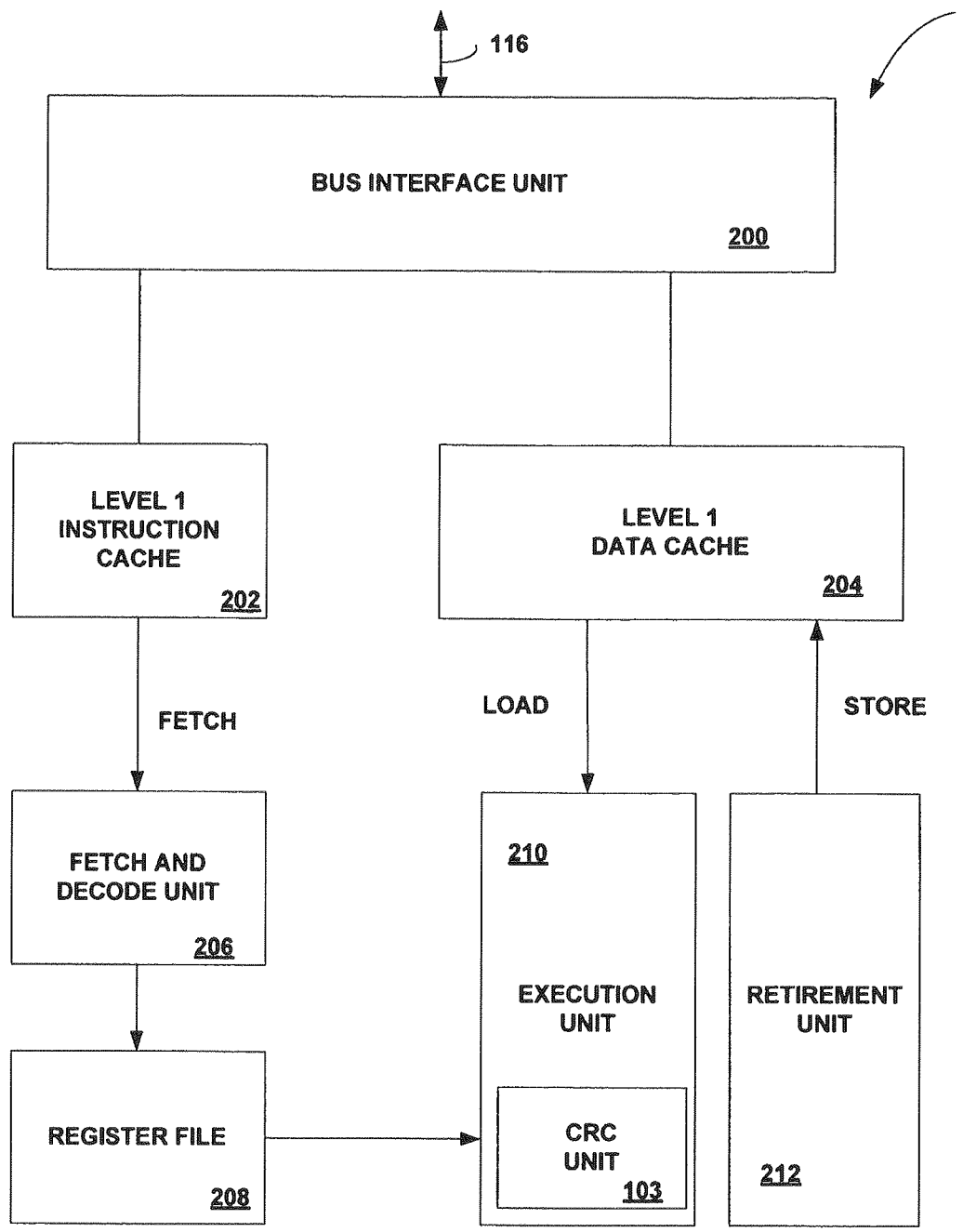
FIG. 2 is a block diagram of an embodiment of the processor shown in FIG. 1.

FIG. 2 is a block diagram of an embodiment of the processor 101 shown in FIG. 1. Processor 101 includes a fetch and decode unit 202 for decoding processor instructions received from Level 1 (L1) instruction cache 202. Data to be used for executing the instruction (for example, input operands used by the instruction) may be stored in register file 208. In one embodiment, the register file 208 includes a plurality of registers, which are used by a flexible CRC instruction to store data (operands) for use by the flexible CRC instruction.

In one embodiment, for an instruction set that supports n-bit polynomials up to a maximal degree of 32, the register file has a plurality of 64-bit registers. In other embodiments, the registers may have more than 64-bits. For example, the register file can include a plurality of 2m-bit registers for a flexible CRC instruction set may support m-bit polynomials up to a maximal degree of m.

The fetch and decode unit 202 fetches macroinstructions from L1 instruction cache 202, decodes macroinstructions and breaks them into simple operations called micro operations (.mu.ops). The execution unit 210 schedules and executes the micro operations. In the embodiment shown, the CRC unit 103 in the execution unit 210 includes micro operations for the flexible CRC instruction. The retirement unit 212 writes the results of executed macroinstructions to registers or memory 108 (FIG. 1).

Figure 3:
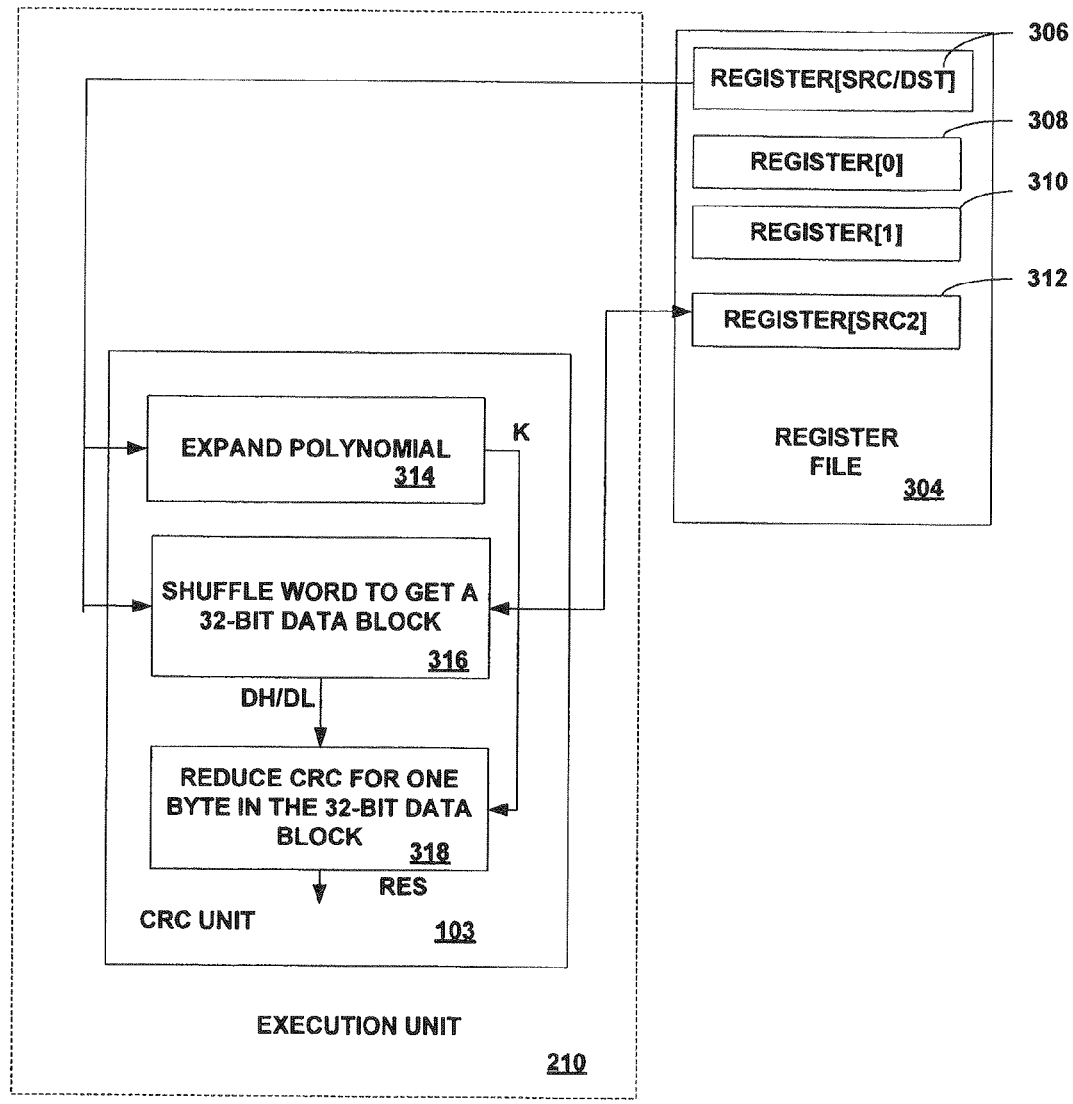
FIG. 3 is a block diagram illustrating an embodiment of an execution unit shown in FIG. 2 to perform flexible CRC according to the principles of the present invention.

FIG. 3 is a block diagram illustrating an embodiment of an execution unit 210 shown in FIG. 2 for executing a flexible CRC instruction according to the principles of the present invention.

After a flexible CRC instruction has been decoded by the fetch and decode unit 206, the execution of the flexible CRC instruction by the execution unit 210 involves performing the micro operations in the CRC unit 103 that are associated with the flexible CRC instruction.

A flexible CRC instruction (macro instruction) to perform a CRC operation in the CRC unit 103 using a programmable n-bit polynomial provided in an source ("input") operand may be defined symbolically as:
Flex_CRC32 r64,r/m64

The flexible CRC instruction has two source operands. The first operand ("op1") is stored in a first 64-bit register (r64) in the register file 304 and is used to store both the 32-bit polynomial and the initial 32-bit CRC residue ("initial CRC") for the CRC operation. The second operand ("op2") also stored in the register file 304 can store a 64-bit data (data block to be reduced) or a 64-bit pointer to a memory location in memory 108 (FIG. 1) in which the 64-bit data (data block to be reduced) is stored.

The flexible CRC instruction performs the CRC operation on the 64 bit data block using the initial CRC residue provided in the first source operand and the polynomial provided in the first source operand. By allowing the polynomial to be provided in one of the source operands, the CRC instruction is flexible in contrast to a CRC instruction that uses a fixed polynomial stored in the CRC unit 103. The 64-bit register identified in the first operand is also used as a destination operand to store the result of the CRC operation. The result of the CRC operation can be referred to as the "new residue". Both the 32-bit "new residue" and the 32-bit programmable polynomial are stored in the 64-bit register identified by the first operand.

The "initial residue" and programmable polynomial are stored in the 64-bit register identified by the first operand prior to issuing the flexible CRC instruction. In an embodiment, the polynomial has a maximal degree of 32, that is, the $x^{32}$ term (bit 33 of the 33-bit polynomial is set to logical '1'. In an embodiment, the 32 Least Significant bits of operand 1 (that is, bits[31:0]) store the initial residue and the 32 Most Significant bits of operand 1 (that is, bits 63:32) store the least significant 32-bits of the 33-bit programmable polynomial. Prior to storing in the 32 Most Significant bits of the first operand, the 33-bit programmable polynomial is left justified with an "implied" leading '1' (that is, as the polynomial has a maximal degree of 32, it is implied that bit 33 is set to logical '1') and bit 33 is dropped. In an embodiment, that has registers (for example, in a register file) 304 with greater than 64-bits, the flexible CRC instruction can support polynomials having a maximal degree greater than 32.

A CRC operation is a special type of hash function that is used for producing a digest (typically 32 bits) of a large data block such as files (in storage) or network packets (in networking). The digest is computed and appended to the data block before storing or transmitting, and then re-computed from the data block and compared to the original, in order to verify that the data block has not been changed while stored in memory or a storage medium or while transmitted over a network.

A CRC is the reminder of one binary polynomial modulo another. The bit stream (data block/messages) can be viewed as a polynomial with binary coefficients, where a bit that is set to logical '1' in the stream corresponds to a '1' coefficient of the polynomial, and where the Least Significant bit of the stream corresponds to the free coefficient of the polynomial. Operations are defined on these polynomials/bit strings.

For example, Internet SCSI (iSCSI) (defined in Request for Comments (RFC) 3385) uses CRC (Cyclic Redundancy Check) for end-to-end data protection. The iSCSI CRC uses a 33-bit polynomial 11EDC6F41 (in hexadecimal format). The 33-bit Internet Small Computer Systems Interface (iSCSI) polynomial 11EDC6F41H when written as a 33 bit binary number is 100011110110111000110111101000001. This 33 bit binary number corresponds to the polynomial below: $x^{32}+x^{28}+x^{27}+x^{26}+x^{25}+x^{23}+x^{22}+x^{19}+-x^{18}+x^{14}+x^{13}+x^{11}+x^{10}+x^{9}+x^{8}+x^{6}+1$ Polynomial addition corresponds to a bitwise Exclusive OR (XOR) operation. XOR is a logical operation on two operands that results in a logical value of '1', if only one of the operands has a logical value of F. The result is a logical value of '0' if both logical values are the same (both '0' or both '1'). For example, the XOR of a first operand having a value '11001010' and a second operand having a value '1000001F' provides a result having a value '01001001'.

Polynomial multiplication corresponds to carry-less multiplication of bit strings. For example, a left shift of t positions of a binary string corresponds to polynomial multiplication by $x^t$. If $P(x)$, $Q(x)$, $R(x)$, $W(x)$ satisfy $P(x)=W(x)*Q(x)+R(x)$ and the degree of $R(x)$ is less than that of $P(x)$, $R(x)$ is the remainder of $P(x)$ modulo $W(x)$.

Using these terms, the CRC value of a message M of any length in bits, corresponding to the binary polynomial $M(x)$ can be defined as CRC $M(x)=x^{32}*M(x)$ mod $P(x)$ where the polynomial $P(x)$ defines the CRC algorithm. For a 32 bits CRC algorithm, $P(x)$ is some polynomial of degree 32.

In an embodiment, the flexible CRC instruction is implemented in CRC unit 103 in the execution unit 210 using a combination of three different micro-operations. The three micro-operations shown in FIG. 3 are (1) expand polynomial 314, (2) shuffle word 316 and (3) CRC reduce 318.

The expand polynomial micro-operation 314 receives a polynomial stored in the Most Significant bits (MSbs) of a first operand ("op1") which in the embodiment shown in FIG. 3 is stored in register 306 in the register file 304. The expand polynomial micro-operation 314 derives a pre-computed polynomial K from the n-bit programmable polynomial provided in op1. The 32 Least Significant bits of the pre-computed polynomial K is stored by the CRC unit 103 for use later by the CRC reduce micro-operation 318. The pre-computed polynomial K reduces the number of gate delays needed to determine a CRC residue by allowing calculations to be performed in parallel.

The expand polynomial micro-operation 314 can be defined symbolically as: dest:=crc_expand_poly(-,source1), select_modifier The expand polynomial micro-operation 314 computes the 32-bit pre-computed polynomial $K=x^{36}$ MOD POLY and stores the 32 Least Significant bits of K. Modulo reduction is defined as polynomial division over the Galois Field (GF(2)).

The pre-computed polynomial K is a multiple of the 32-bit CRC polynomial over Galois Field (GF(2)). The form of the pre-computed polynomial K allows many of the calculations to be performed in parallel by processing mutually exclusive regions of the data block to be reduced in parallel. Performing calculations in parallel reduces the time to compute the CRC residue. For example, the pre-computed polynomial K used by the CRC reduce micro-operation 318 allows 4 Most Significant bits (bits 39-36 of a 40-bit input data) to be reduced in parallel. For example, for a polynomial of maximal degree 32, with k having 32-bits, applying the 32 Least Significant bits of K to a 40-bit input data (32-bit polynomial plus 8-bit data) reduces the 40-bit input data to a 36-bit residue.

In an embodiment, the shuffle word micro-operation 316 receives source operand 1 ("op1") from register 306 and source operand 2 ("op2") from register 312 in the register file 304 (or from the memory location identified by the memory pointer stored in register 312) and selects one of the 32-bit portions of the 64-bits in each of the operands dependent on a modifier stored in an immediate byte. The micro-operation may be defined symbolically as: dest:=shuffle_word (source2,source1),imm8

The shuffle word micro-operation 316 performs a shuffle of word-level data (32-bits) between the two halves of the 64-bit datapath. This micro-operation selects either the 32-bit Most Significant bits (top half) or the 32-bit Least Significant bits (bottom half) from each of the respective 64-bit operands.

Bits within the selected half can also be shuffled. The shuffling of the bits within each operand is dependent on a 4-bit shuffle select modifier that is stored in immediate data (imm8). The result of the shuffle is stored in the destination register ("dest").

If this is the first call to the shuffle word micro-operation 316 for the flexible CRC instruction, immediate data ("imm8") indicates that the most significant 32-bits are to be selected from the 64-bit second operand ("op2") received by the flexible CRC macro-instruction.

The CRC reduce micro-operation 318 is performed for each of the four bytes in the 32-bit data provided by the shuffle word micro-operation 316. The CRC reduce micro-operation 318 also uses the 32-bit initial residue received from the shuffle word micro-operation 316, the programmable polynomial and the pre-computed polynomial K computed by the expand polynomial micro-operation to compute a residue (RES).

After the execution of the flexible CRC instruction is complete, the accumulated residue and polynomial are stored in operand 1 (which is both destination and source register for the macro-instruction) which in the embodiment shown in FIG. 3 can be stored in register 306 in the register file 304.

Figure 4:
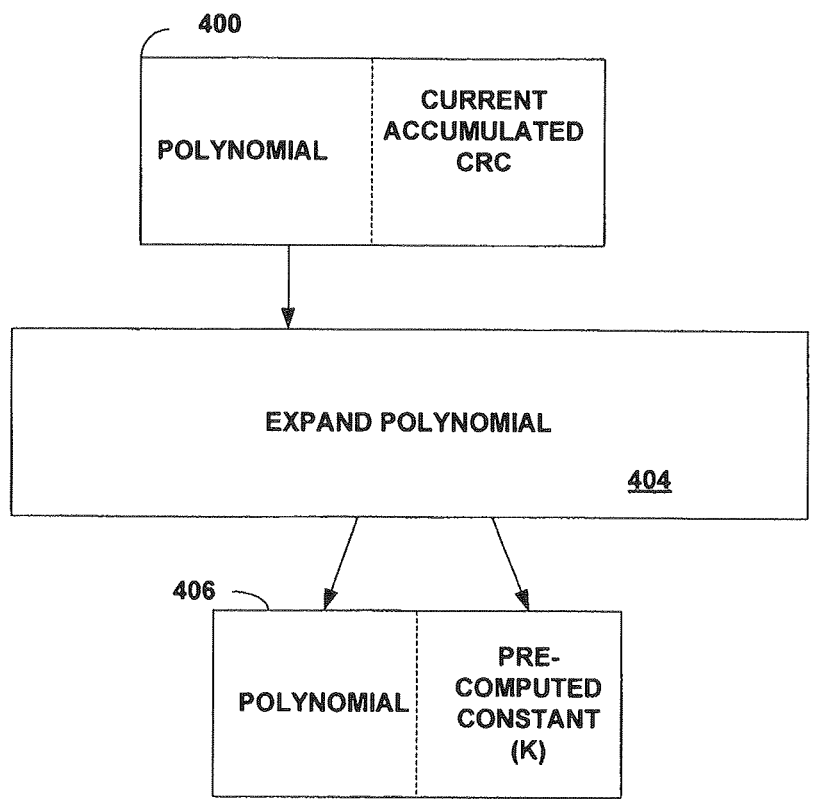
FIG. 4 illustrates an embodiment of the expand polynomial micro-operation shown in FIG. 3.

FIG. 4 illustrates an embodiment of the expand polynomial micro-operation 314 shown in FIG. 3. In an embodiment in which the CRC polynomial is a 32-bit polynomial (POLY) of the form $x^{32}=p^{31}.x^{31}+p^{30}.x^{30}+\ldots p^0$, the 32-bit polynomial represented by [$p^{31} \ldots p^0$] is stored in the 32 Most Significant bits (top half) of the source register 400. The implied leading "one" corresponding to $x^{32}$ is omitted.

The modulo operation (MOD) computes the remainder of division of $x^{36}$ by POLY. For example, the remainder r=a mod n, is the remainder when a is divided by n. In the case that a is 10 and n is 3, r is 1.

The expand polynomial micro-operation 314 computes the residue of $K=x^{36}$ MOD POLY and stores it as a pre-computed polynomial constant K in the destination register 406. The modulo reduction is defined as polynomial division over Galois Field (GF(2)).

The original 32-bit polynomial is also stored in the destination register 406. The pre-computed polynomial constant (residue) K and the original 32-bit polynomial (polynomial) are used during subsequent CRC reduction (reduce) operations to reduce the number of Exclusive OR (XOR) operations performed to compute the residue. XOR operations are performed using the 32-bit polynomial in order to reduce the 64-bit data block provided to the flexible CRC macro-instruction to a 32-bit residue.

Figure 5:
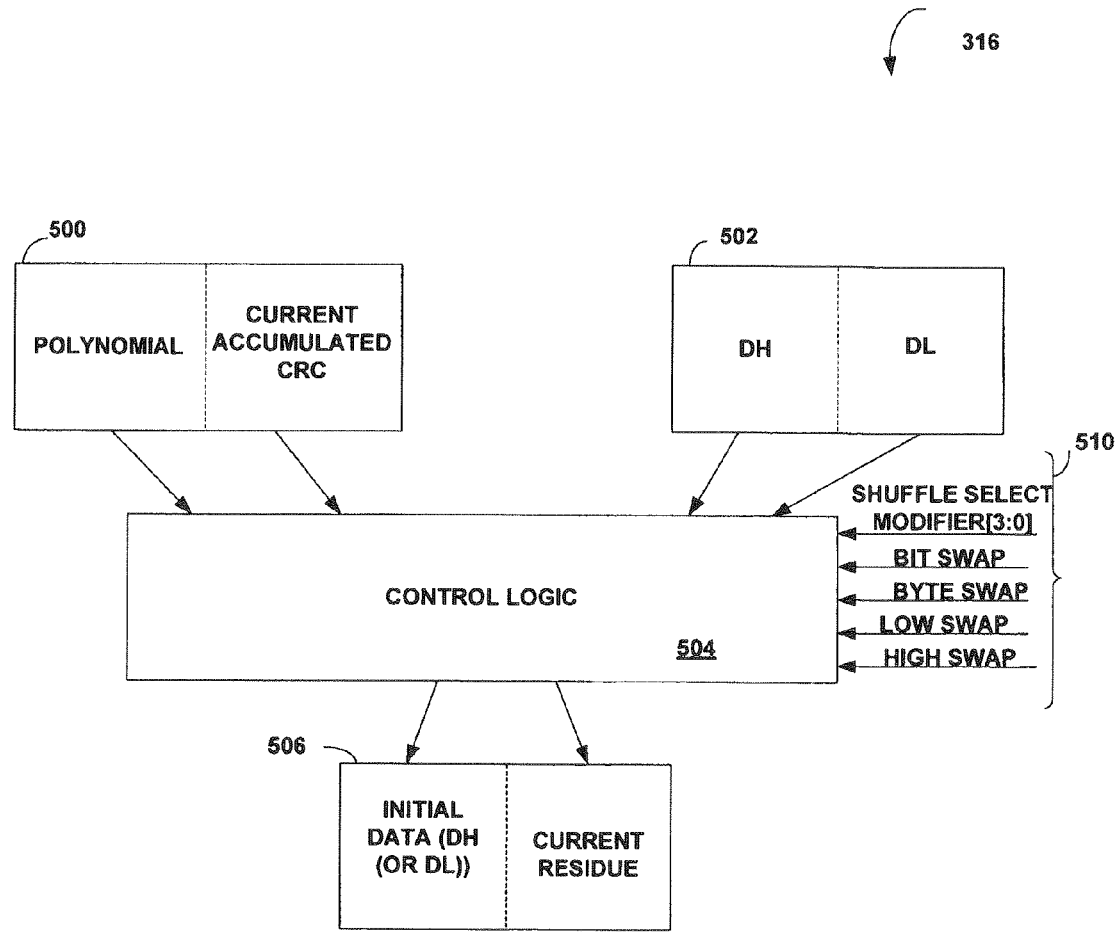
FIG. 5 illustrates an embodiment of the shuffle word micro-operation shown in FIG. 3.

FIG. 5 illustrates an embodiment of the shuffle word micro-operation 316 shown in FIG. 3.

In the embodiment shown in FIG. 5, the control logic 504 is programmable dependent on the state of the state modifier and swap bits in the immediate byte 510 provided in the shuffle word micro-operation 316. The immediate byte 510 is used by the control logic 504 to perform bit/byte reflects on the data/residue, that is, to map bytes/bits in both source 1 500 and source 2 502 to bytes/bits in destination 506. In the embodiment shown, source 1 500, source 2 502 and destination 506 all have 64-bits. In other embodiments, source 1 500, source 2 502 and destination 506 may have more than 64-bits.

In one embodiment, the four Least Significant bits of the immediate byte 510 that is, SHUFFLE SELECT MODIFIER [3:0] are used by control logic 504 to select which 32-bit portion of the 64-bit source 1 500 and 64-bit source 2 502 is forwarded to which 32-bit portion of the 64-bit destination 506. With the 2 Least Significant bits, that is, SHUFFLE SELECT MODIFIER [1:0] selecting which of the four 32-bit portions to forward to the lower 32-bits of the destination and the two Most Significant bits, that is, SHUFFLE SELECT MODIFIER[2:3] selecting which of the four 32-bit portions to forward to the upper 32-bits of the destination.

Tables 1 and 2 below illustrate how 32-bit word in the source operand is mapped to a 32-bit word in the destination dependent on the state of SHUFFLE SELECT MODIFIER [3:0].

TABLE-US-00001 TABLE 1 SHUFFLE SELECT MODIFIER[1:0] Swap Operation 00 source1[31:0]→dest[31:0] 01 source1 [63:32]→dest[31:0] 10 source2[31:0]→dest[31:0] 11 source2[63:32]→dest[31:0]

TABLE-US-00002 TABLE 2 SHUFFLE SELECT MODIFIER[3:2] Swap Operation 00 source1[31:0]→dest[63:32] 01 source1[63:32]→dest[63:32] 10 source2[31:0]→dest[63:32] 11 source2 [63:32]→dest[63:32]

If the bit swap bit in the immediate byte 510 is enabled, (for example, set to logical '1') the order of the 32-bits are swapped, for example, bits [31:0] in one of the sources are stored as bits [0:31] in the destination, such that the Most Significant bit 31 is stored in the Most Significant bit location of the destination. The state of the high swap/low swap bits indicate whether the bit swap is performed on the least significant 32-bits of the destination 506 or the most significant 32-bits of the destination 506. The state of the byte swap bit ('1' or '0') indicates whether the four bytes in the 32-bit half of a source 500, 502 are swapped when moving the data to the destination 506. For example, a byte swap of the 32 Least Significant bits in source 502, stores the most significant byte (bits 31:24) of the source 502 in the Least Significant bits (bits 7:0) of the destination 506.

Tables 3 and 4 below summarize the bit/byte reflects on the data/residue performed by the shuffle word micro-operation 314 dependent on the state of bits 7:5 of the immediate byte. In the embodiment shown, bit 7 (swap(H)) (Swap (L)) enables/disables swapping on the high half of the destination; bit 6 enables/disables swapping on the low half of the destination; bit 5 (Byte Swap) enables/disables byte swap enable and bit 4 (Bit swap) enables/disables bit swap enable.

TABLE-US-00003 TABLE 3 Byte Bit Swap(H): Swap(L): Swap: Swap Swap Operation 0 1 0 0 dest[31:0]=temp_dest[31:0] 0 1 0 1 temp_dest[31:0]=temp dest [0:31]=dest[31:0]=temp_dest[31:0] 0 1 1 1 temp_dest [31:0]=temp dest [0:31] dest[31:24]=temp_dest[7:0] dest[23:16]=temp_dest[15:8] dest[15:8]=temp_dest [23:16] dest[7:0]=temp_dest[31:24]

TABLE-US-00004 TABLE 4 Byte Bit Swap(H): Swap(L): Swap: Swap Swap Operation 1 0 0 0 dest[63:32]= temp_dest[63:32] 1 0 0 1 temp_dest[63:32]=temp dest [32:64] dest[63:32]=temp_dest[63:32] 1 0 1 1 temp_ dest[63:32]=temp dest[32:64] dest[63:56]=temp_dest [39:32] dest[55:48]=temp_dest[47:40] dest[47: 40=temp_dest[55:48] dest[39:32]=temp_dest[63:56]

In one embodiment instead of providing an immediate byte with the micro-operation, the control logic is hardwired to always map the CRC residue stored in the 32 Least Significant bits of source 1 to the 32 Least Significant bits of the destination. The control logic is also hardwired to map either the Most Significant 32-bits of data from source 2 to the Most Significant 32-bits of destination or the Least Significant 32-bits of data from source 2 to the Most Significant 32-bits of destination dependent on whether the shuffle word micro-operation is called the first or second time in the flexible CRC macroinstruction.

In one embodiment instead of providing an immediate byte with the micro-operation, the control logic is hardwired to always map the CRC residue stored in the 32 Least Significant bits of source 1 to the 32 Least Significant bits of the destination. The control logic is also hardwired to map either the Most Significant 32-bits of data from source 2 to the Most Significant 32-bits of destination or the Least Significant 32-bits of data from source 2 to the Most Significant 32-bits of destination dependent on whether the shuffle word micro-operation is called the first or second time in the flexible CRC macroinstruction.

Figure 6:
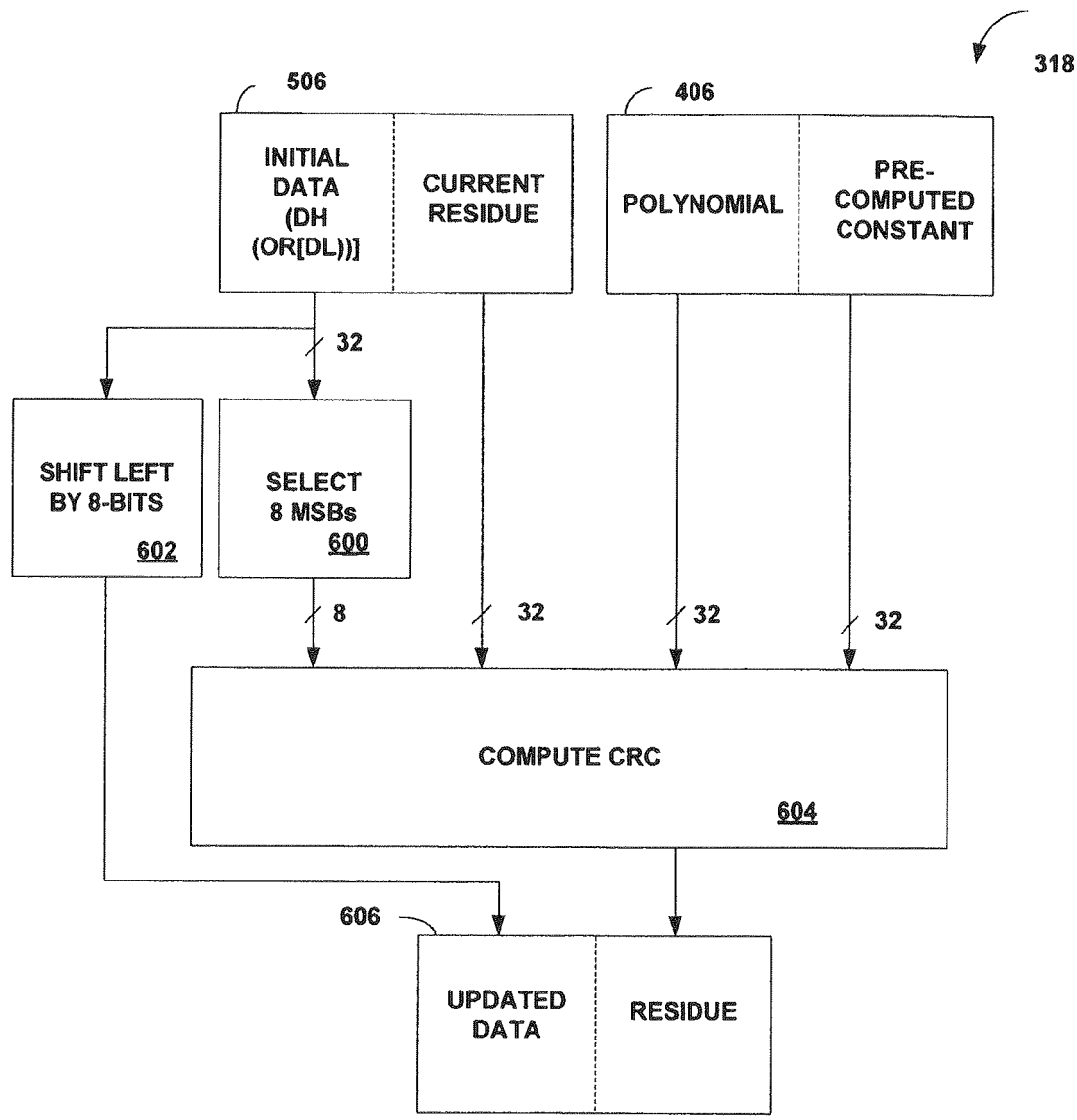
FIG. 6 illustrates an embodiment of the CRC reduce micro-operation shown in FIG. 3.

FIG. 6 illustrates an embodiment of the CRC reduce micro-operation 318 shown in FIG. 3. The CRC reduce micro-operation 318 performs a reduction of 8-bits from the data block (data stream) using the 32-bit polynomial and the 32-bit pre-computed polynomial K.

A CRC reduction function is performed using the polynomial provided in source 406 on an 8-bit block of data selected from the 32-bit data provided in source 506. An additional pre-computed polynomial K computed by the expanded polynomial micro-operation 316 discussed in conjunction with FIG. 4 and provided in the 32 Most Significant bits of source 406 is also used by the CRC reduction function. If the CRC polynomial is a 32-bit polynomial (POLY) of the form $x^{32}=p^{31} \cdot x^{31}+p^{30} \cdot x^{30}+\ldots p^0$, the 32-bit polynomial represented by $[p^{31} \ldots p^0]$ is given as input in the 32 Most Significant bits of the source 406 (the implied leading "one" corresponding to $x^{32}$ is omitted). The 32 Least Significant bits of source 406 stores the pre-computed polynomial $K=x^{36}$ MOD POLY.

The 64-bit source register 506 stores both initial data (DH or DL) and current CRC accumulated residue ("current residue") with the 32 Most Significant bits storing the data and the 32 Least Significant Bits storing the current CRC residue. The result of the compute CRC micro-operation ("residue") is stored in the 32 Least Significant Bits of the destination register 606.

Computing a CRC requires calculating the remainder resulting from the division of the input data by a generator value. A CRC is computed for a 32-bit segment of a data stream that is stored in source register 506. The 32-bit data is shifted by 8-bits in shift logic 602 and the shifted data is then stored in the destination register 606 as "updated data" for use by a subsequent CRC reduce micro-operation 318. A CRC operation is performed on the 8 Most Significant bits of the data stored as "initial data" in source register 506. The pre-computed polynomial K and the polynomial are used to compute the CRC residue which is stored in destination register 606.

Figure 7:
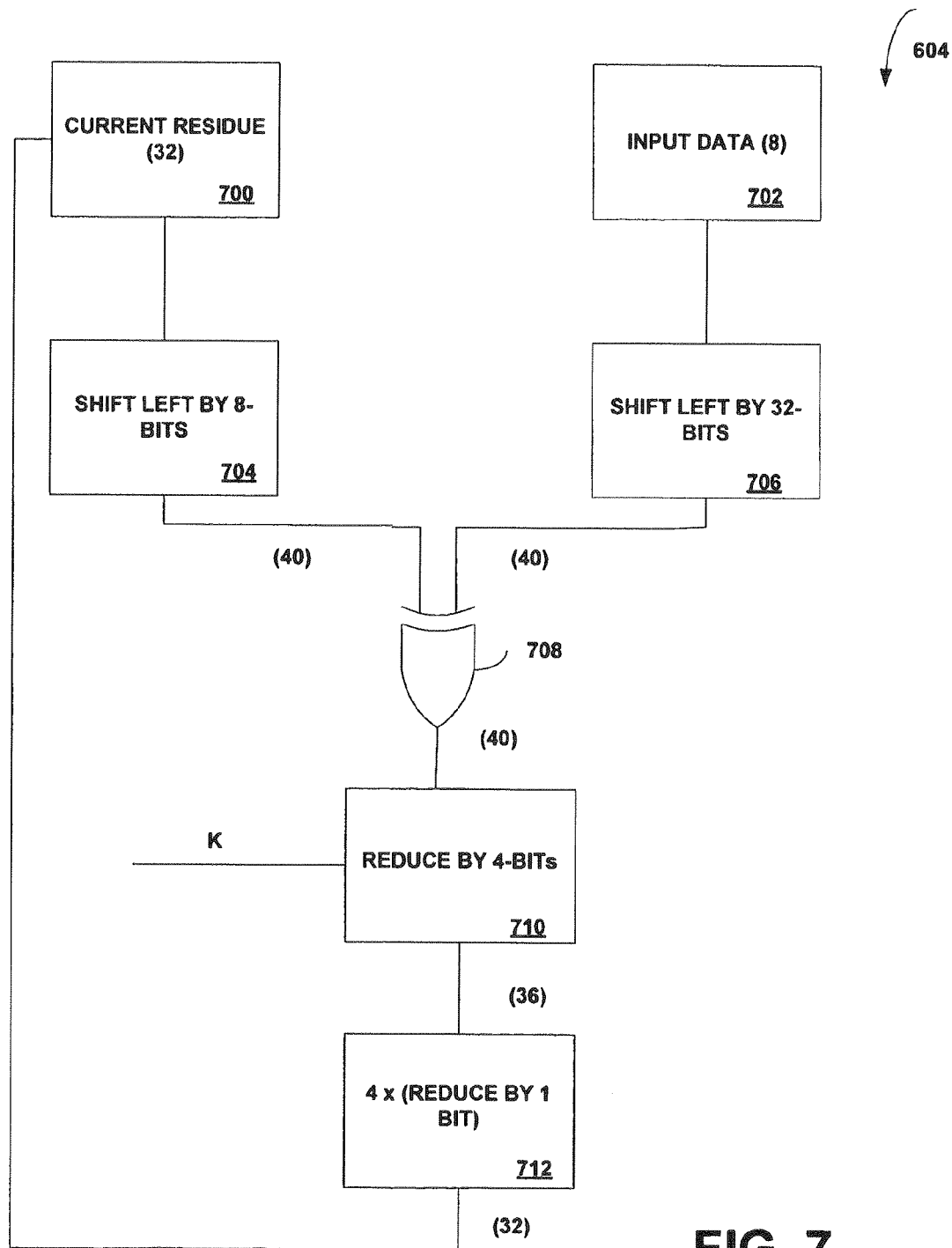
FIG. 7 is a block diagram illustrating an embodiment of the compute CRC function shown in FIG. 6.

FIG. 7 is a block diagram illustrating an embodiment of the compute CRC logic 604 shown in FIG. 6.

The compute CRC logic 604 performs a CRC operation on successive portions (segments) of a data stream in 8-bit segments 702. The 8-bit segment is shifted by 32 bits and an XOR operation is performed with the shifted 8-bit segment and any pre-existing residue (remainder) which is also shifted by 8-bits. The XORed 40-bit result (input data) and the 32-bit pre-computed polynomial K are used to compute the 32-bit CRC residue in stages. In the 4-bit reduction stage 712, the 40-bit input data is reduced by 4-bits using the 32-bit pre-computed polynomial K to provide a 36-bit residue. The 36-bit residue is input to stage 712 which includes four separate one-bit reduction stages, each one of which performs a one-bit reduction operation to reduce the 36-bit residue by one bit. After all four one-bit reduction operations have been performed in stage 712, the 32-bit residue is fed back to process the next 8-bit segment of the data stream.

If this is the last 8-bit segment of the last 32-bit data block of the data stream, this is the final residue which can be appended to the data stream if the data stream is being transmitted or can be compared with a received CRC to verify that the data stream has not been corrupted.

The stages 710, 712 are constructed so that the stage outputs and the initial input are congruent with each other with respect to the final residue. Re-programming for a different polynomial merely requires computing a different pre-computed polynomial K. The pre-computed polynomial K has a leading one bit (i+kth) bit followed by i-zeros and k bits of data of the order of the generating polynomial. Only the k Least Significant bits of data are stored for use by other micro-operations as discussed earlier. In the embodiment in which operands have 2n-bits, k is n-bits. For example, in an embodiment with 64-bit operands, k is the 32 Least Significant bits of the pre-computed polynomial K.

Figure 8:
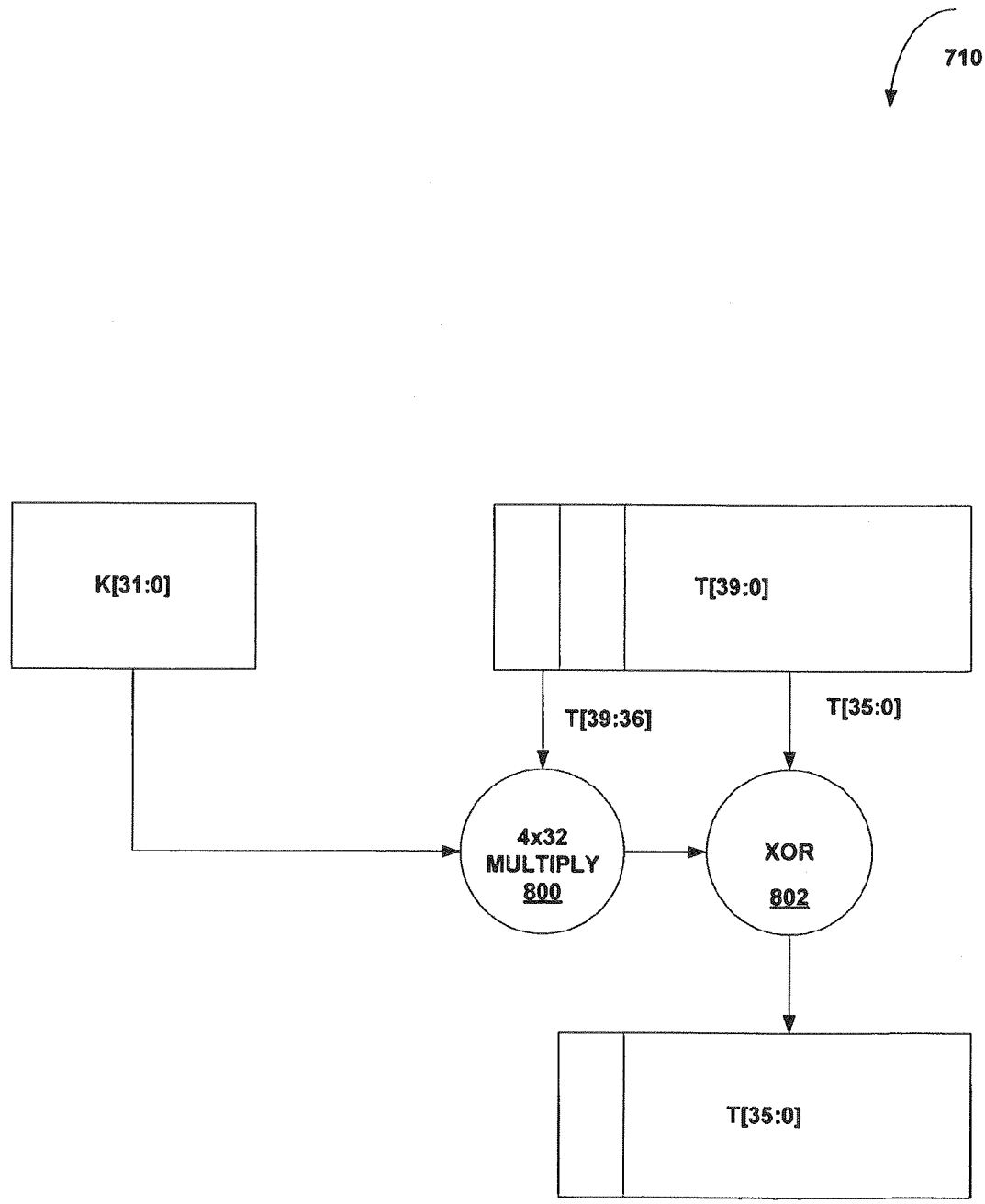
FIG. 8 is a block diagram illustrating the 4-bit reduction stage shown in FIG. 7.

FIG. 8 is a block diagram illustrating the 4-bit reduction stage 710 shown in FIG. 7. The 4-bit reduction stage 710 receives a 40-bit input and reduces the input data segment using the 32-bit K pre-computed polynomial to a 36-bit output. First, a 4.times.32 multiply operation is performed in multiply logic 800 with the 4 Most Significant bits of the 40-bit input data segment T[39:36] and the 32-bit K pre-computed polynomial K[31:0]. Next, an XOR operation is performed in XOR logic 802 on the 36-bit result of the multiply operation and the 36 Least Significant bits of the 40-bit input data segment to provide a 36-bit output T[3:0] that is forwarded to a next reduction stage 712 (FIG. 7) to continue to compute the 32-bit residue.

In an embodiment, the 4.times.32 multiply logic 800 includes an array of AND gates and a shift logic having a plurality of XOR gates. The array of AND gates includes four sets of 32 AND gates, one set of 32 AND gates for each one of the 4 Most Significant bits of the 40-bit input data segment. Each respective one of the four Most Significant bits is provided to one input of each of the 32-bit AND gates in one of the plurality of sets of AND gates. For example, T[39] is coupled to one input of all 32-bit AND gates in a first set and T[38] is coupled to one input of all 32 NAND gates in a second set. The respective Most Significant bit is ANDed with a respective bit of the 32-bit K pre-computed polynomial K[31:0]. For example, in the first set of 32 AND gates, one input of each of the 32 AND gates receives the Most Significant bit of the 40-bit input data segment and each of the 32 AND gates receives a respective one of the 32-bits of the 32-bit K pre-computed polynomial.

The outputs of the 4 sets of AND gates (128 (32.times.4)) AND gates are coupled to shift logic to shift (multiply) the outputs in accordance with the respective bit positions of the input data. The outputs of the set of AND gates operating on the Most Significant bit (bit 39) are shifted by 3 bits, and each succeeding set of AND gates decrements this shift by one-bit with the last set shifting by 0 bits.

The shifted 36-bit result is subtracted in XOR logic 802 (using a plurality of XOR gates) from the 36 Least Significant bits of the input data (T[35:0]) to provide the 36-bit input to stage 712.

Figure 9:
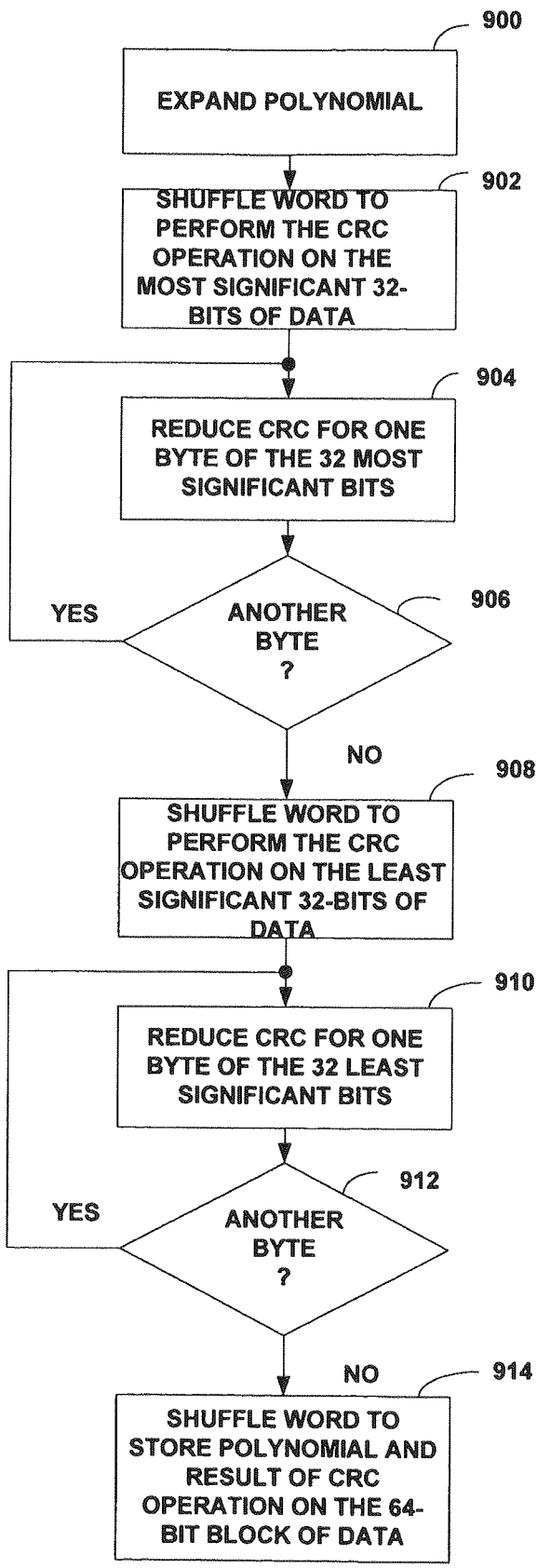
FIG. 9 is a flow graph illustrating an embodiment of a method for performing CRC according to the principles of the present invention.

FIG. 9 is a flowgraph illustrating an embodiment of a method for performing a flexible programmable CRC operation according to the principles of the present invention. FIG. 9 will be described in conjunction with FIGS. 2 and 3.

After a flexible CRC instruction has been decoded by the fetch and decode unit 206 (FIG. 2), the execution of the flexible CRC instruction by the execution unit 210 involves performing a plurality of micro operations associated with the flexible CRC instruction in the CRC unit 103.

As discussed earlier, the flexible CRC instruction (macro instruction) to perform a CRC operation in the CRC unit may be defined symbolically as:

Flex_CRC32 r64,r/m64

Referring to FIG. 9, at block 900, an expand polynomial micro-operation 314 (FIG. 3) receives a polynomial stored in the Most Significant bits in a first operand which is stored in register 306 in the register file 304. The expand polynomial micro-operation 314 performs a CRC expansion function for the given polynomial and provides a pre-computed polynomial K which is used by CRC reduce (reduction) micro-operation 318 for the flexible CRC instruction. In an embodiment, the 32 Least Significant bits of the pre-computed polynomial K are stored in a register, for example, register 308 or register 310 in the register file 304 for use by the CRC reduce micro-operation 318. The expand polynomial micro-operation 314 may be defined symbolically as:

dest:=crc_expand_poly(-,source1),select_modifier

The expand polynomial micro-operation 314 computes the 32-bit pre-computed polynomial K=x.sup.36 MOD POLY. Modulo reduction is defined as polynomial division over the Galois Field (GF(2)). The pre-computed polynomial K is used by the CRC reduce micro-operation 318 (FIG. 3). Processing continues with block 902.

At block 902, a shuffle word micro-operation 316 receives operand 1 stored in register 306 and operand 2 stored in register 312 in the register file 304 (or from the memory location identified by the memory pointer stored in register 312). The shuffle word micro-operation 316 selects one of the 32-bit portions of the 64-bits in each of the operands dependent on a modifier stored in an immediate byte ("select modifier"). The shuffle word micro-operation 316 may be defined symbolically as:

dest:=shuffle_word(source2,source1),imm8 shuffle word micro-operation 316 implements the shuffle of word-level data (32-bits) between the two 32-bit halves of the 64-bit datapath. The shuffle word micro-operation 316 selects either the Most Significant 32-bits or the Least Significant 32-bits from the respective 64-bit operands. Bits within the selected half (32 MSbs or 3 LSbs) can also be swapped. The shuffling of the bits within each operand is dependent on a 4-bit shuffle select modifier that is stored in immediate data (imm8). The result of the shuffle word micro operation 316 is stored in the destination register (dest). In an embodiment, the result can be stored in a register in the register file 304, for example, register 308 or register 310 for use by other micro-operations.

If this is the first call to the shuffle word micro-operation 316 in the flexible CRC macro-instruction, immediate data indicates that the most significant 32-bits (DH) are to be selected from the 64-bit second operand (op2) received by the macro-instruction. Processing continues with block 904.

At block 904, a separate CRC reduce micro-operation 318 is performed for each of the respective four bytes in the 32-bit data output from the shuffle word micro-operation 316. The 32-bit initial residue from the shuffle word micro-operation (DH), the programmable polynomial and the pre-computed polynomial K computed by the expand polynomial micro-operation 314 are used. Processing continues with block 906.

At block 906, if there is another byte of the 32-bit data block (segment) DH to be reduced, processing continues with block 904. If not, processing continues with block 908.

At block 908, a shuffle word micro-operation 316 receives operand 1 and operand 2 and selects one of the 32-bits of the 64-bits in each of the operands dependent on a modifier stored in an immediate byte. As this is the second call to the shuffle word micro-operation 316 for the flexible CRC reduction macro-instruction, the Least Significant 32-bits (DL) are selected from the second operand (op2) received by the macro-instruction. Processing continues with block 910.

At block 910, a separate CRC reduce micro-operation 318 is performed for each of the respective four bytes in the 32-bit data output by the shuffle word micro-operation 316 using the pre-computed polynomial K computed by the expand polynomial micro-operation 314. Processing continues with block 912

At block 912, if there is another byte in the 32-bit data block (DL) to reduce, processing continues with block 910. If not, processing continues with block 910.

At block 914, a shuffle word micro-operation 316 receives the result of the two CRC reduce micro-operations 318 and stores the results and the n-bit polynomial in the destination (op1).

The execution of the flexible CRC instruction is complete, with the accumulated residue and polynomial stored in operand 1 (which is both destination and source register for the flexible CRC macro-instruction).

It will be apparent to those of ordinary skill in the art that methods involved in embodiments of the present invention may be embodied in a computer program product that includes a computer usable medium. For example, such a computer usable medium may consist of a read only memory device, such as a Compact Disk Read Only Memory (CD ROM) disk or conventional ROM devices, or a computer diskette, having a computer readable program code stored thereon.

While embodiments of the invention have been particularly shown and described with references to embodiments thereof, it will be understood by those skilled in the art that various changes in form and details may be made therein without departing from the scope of embodiments of the invention encompassed by the appended claims.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A processor comprising:
a fetch unit to fetch instructions;
a decode unit to decode the fetched instructions; and
an execution unit to execute a Cyclic Redundancy Check (CRC) instruction that identifies a first operand that stores a current n-bit residue and a programmable n-bit polynomial and a second operand that stores a 2n-bit data block, the CRC instruction to cause the execution unit to:
perform a sequence of micro-operations to expand the programmable n-bit polynomial to provide a pre-computed polynomial K, shuffle an n-bit portion from the first operand and an n-bit portion from the second operand based on an immediate data, and reduce an n-bit portion of the 2n-bit data block using the programmable n-bit polynomial, the current n-bit residue of the first operand and the pre-computed polynomial K, to provide an n-bit residue.

2. The processor of claim 1, wherein the programmable n-bit polynomial has a maximal degree of n+1.

3. The processor of claim 1, wherein the first operand has 2n-bits and the second operand has 2n-bits.

4. The processor of claim 3, wherein n is 32.

5. The processor of claim 1, wherein the first operand is both a source and a destination and the n-bit residue is to be stored in the first operand.

6. The processor of claim 1, wherein the execution unit is to perform a shuffle word micro-instruction to shuffle bits within respective n-bit portions of the first and second operands.

7. The processor of claim 1, wherein the sequence of micro-operations comprises:
a CRC reduction micro-instruction to reduce an n+8-bit data using the pre-computed polynomial K to provide an n+4-bit intermediate residue and to reduce the n+4 intermediate residue to the n-bit residue using the n-bit polynomial.

8. A method comprising:
performing a sequence of operations for a Cyclic Redundancy Check (CRC) instruction, the CRC instruction specifying a first operand and a second operand, the sequence of operations to perform a Cyclic Redundancy Check (CRC) operation on a 2n-bit data block stored in the second operand using a programmable n-bit polynomial stored in the first operand, comprising:
expanding the programmable polynomial to provide a pre-computed polynomial K; and
performing a sequence of micro-operations on the 2n-bit data block using the programmable n-bit polynomial and a current n-bit residue stored in the first operand and the pre-computed polynomial K to provide an n-bit residue for the 2n-bit data block, wherein performing the sequence of micro-operations comprises reducing an n+8-bit data using the pre-computed polynomial K to provide an n+4-bit intermediate residue and reducing the n+4 intermediate residue to the n-bit residue using the programmable n-bit polynomial.

9. The method of claim 8, wherein the programmable n-bit polynomial has a maximal degree of n+1.

10. The method of claim 9, wherein the first operand has 2n-bits and the second operand has 2n-bits.

11. The method of claim 10, wherein n is 32.

12. The method of claim 9, wherein the first operand is both a source and a destination and the n-bit residue is stored in the first operand.

13. The method of claim 9, wherein performing the sequence of micro-operations comprises:
performing a shuffle by selecting an n-bit portion from the first operand and an n-bit portion from the second operand to store in a 2n-bit destination operand.

14. The method of claim 13, further comprising performing the shuffle to shuffle bits within the respective n-bit portions.

15. A system comprising:
a processor including:
an execution unit to execute a Cyclic Redundancy Check (CRC) instruction that identifies a first operand that stores a current n-bit residue and a programmable n-bit polynomial and a second operand that stores a 2n-bit data block, the CRC instruction to cause the execution unit to:
perform a sequence of micro-operations to expand the programmable n-bit polynomial to provide a pre-computed polynomial K, shuffle an n-bit portion from the first operand and an n-bit portion from the second operand based on an immediate data, and reduce an n-bit portion of the 2n-bit data block using the programmable n-bit polynomial, the current n-bit residue of the first operand and the pre-computed polynomial K, to provide an n-bit residue; and
a dynamic random access memory coupled to the processor.

16. The system of claim 15, wherein the processor comprises a fetch unit to fetch instructions.

17. The system of claim 16, wherein the processor further comprises a decode unit to decode fetched instructions.

18. The system of claim 17, wherein the processor further comprises a register file including a plurality of registers.

19. The system of claim 17, wherein the processor further comprises a retirement unit to retire executed instructions.

20. The system of claim 19, wherein the processor further comprises a cache coupled to the execution unit and the retirement unit.

* * * * *